(12) United States Patent
Enyama et al.

(10) Patent No.: US 10,755,396 B2
(45) Date of Patent: Aug. 25, 2020

(54) IMAGE FORMING APPARATUS

(71) Applicant: HITACHI, LTD., Chiyoda-ku, Tokyo (JP)

(72) Inventors: Momoyo Enyama, Tokyo (JP); Yasuhiro Shirasaki, Tokyo (JP); Michio Hatano, Tokyo (JP); Makoto Sakakibara, Tokyo (JP)

(73) Assignee: HITACHI, LTD., Tokyo (JP)

( * ) Notice: Subject to any disclaimer, the term of this patent is extended or adjusted under 35 U.S.C. 154(b) by 346 days.

(21) Appl. No.: 15/894,605

(22) Filed: Feb. 12, 2018

(65) Prior Publication Data

US 2018/0232869 A1 Aug. 16, 2018

(30) Foreign Application Priority Data

Feb. 14, 2017 (JP) .................................. 2017-025213

(51) Int. Cl.
*G06T 5/50* (2006.01)
*G06T 1/00* (2006.01)
(Continued)

(52) U.S. Cl.
CPC .............. *G06T 5/50* (2013.01); *G06T 1/0007* (2013.01); *G06T 5/001* (2013.01); *G06T 5/003* (2013.01);
(Continued)

(58) Field of Classification Search
None
See application file for complete search history.

(56) References Cited

U.S. PATENT DOCUMENTS

| 4,941,980 A | 7/1990 | Halavee et al. |
| 7,164,128 B2 | 1/2007 | Miyamato et al. |
(Continued)

FOREIGN PATENT DOCUMENTS

| JP | 2012018813 A | 1/2012 |
| JP | 2013-069693 A | 4/2013 |
(Continued)

OTHER PUBLICATIONS

Office Action for related Japanese Patent Application No. 2017-025213, dated Mar. 31, 2020; English translation provided (10 pages).

*Primary Examiner* — Jiangeng Sun
(74) *Attorney, Agent, or Firm* — Procopio, Cory, Hargreaves & Savitch LLP

(57) ABSTRACT

An image forming apparatus includes an observation image input section in which a plurality of observation images is input, an emphasis information input section that inputs information to be emphasized, a storage section that defines a plurality of conversion functions that converts the plurality of observation images into a converted image on the basis of a function for conversion and takes, as a parameter, a gradation value of each pixel in the plurality of observation images and a plurality of emphasis functions that takes, as a parameter, a gradation value of each pixel in the conversion functions, an image calculation section that calculates an image in which information to be emphasized is emphasized on the basis of the plurality of input observation images, the input information of the information to be emphasized, the conversion functions, and the emphasis functions, and an emphasized image output section that outputs the emphasized image.

12 Claims, 12 Drawing Sheets

(51) Int. Cl.
*G06T 5/00* (2006.01)
*G06T 11/60* (2006.01)
*H01J 37/26* (2006.01)

(52) U.S. Cl.
CPC .......... *G06T 11/60* (2013.01); *G06T 2200/24* (2013.01); *G06T 2207/10061* (2013.01); *G06T 2207/20192* (2013.01); *G06T 2207/20216* (2013.01); *H01J 37/265* (2013.01)

(56) References Cited

U.S. PATENT DOCUMENTS

| | | |
|---|---|---|
| 9,679,744 B2 | 6/2017 | Shirai |
| 2012/0127292 A1* | 5/2012 | Yamazaki .......... A61B 1/00009 348/68 |
| 2014/0015954 A1* | 1/2014 | Tsujimoto ............. G06F 19/321 348/79 |
| 2014/0333751 A1* | 11/2014 | Takayama ............ G02B 21/367 348/79 |
| 2017/0231480 A1* | 8/2017 | Yamazaki ............ A61B 1/0638 600/476 |

FOREIGN PATENT DOCUMENTS

| | | |
|---|---|---|
| JP | 2013-101797 A | 5/2013 |
| JP | 2015-201304 A | 11/2015 |

\* cited by examiner

FIG. 7

| # | INPUTTED IMAGE | STAGE COORDINATES | MICROSCOPE CONDITIONS | IMAGE FORMATION CONDITION | POST-PROCESSING (ANALYSIS) |
|---|---|---|---|---|---|
| 1 | FILE 02 | (0,0,0,0) | HIGH RESOLUTION MODE 1 | A MATERIAL DEVELOPMENT SET | GRAIN DIAMETER DISTRIBUTION MEASUREMENT |
| 2 | FILE 02 | (10,0,0,0) | HIGH RESOLUTION MODE 1 | A MATERIAL DEVELOPMENT SET | GRAIN DIAMETER DISTRIBUTION MEASUREMENT |
| 3 | FILE 02 | (20,0,0,0) | HIGH RESOLUTION MODE 1 | A MATERIAL DEVELOPMENT SET | GRAIN DIAMETER DISTRIBUTION MEASUREMENT |
| 4 | FILE 02 | (30,0,0,0) | HIGH RESOLUTION MODE 1 | A MATERIAL DEVELOPMENT SET | GRAIN DIAMETER DISTRIBUTION MEASUREMENT |
| 5 | FILE 02 | (40,0,0,0) | HIGH RESOLUTION MODE 1 | A MATERIAL DEVELOPMENT SET | GRAIN DIAMETER DISTRIBUTION MEASUREMENT |
| 6 | FILE 02 | (50,0,0,0) | HIGH RESOLUTION MODE 1 | A MATERIAL DEVELOPMENT SET | GRAIN DIAMETER DISTRIBUTION MEASUREMENT |
| 7 | FILE 02 | (0,10,0,0) | HIGH RESOLUTION MODE 1 | A MATERIAL DEVELOPMENT SET | GRAIN DIAMETER DISTRIBUTION MEASUREMENT |
| 8 | FILE 02 | (10,10,0,0) | HIGH RESOLUTION MODE 1 | A MATERIAL DEVELOPMENT SET | GRAIN DIAMETER DISTRIBUTION MEASUREMENT |
| 9 | FILE 02 | (20,10,0,0) | HIGH RESOLUTION MODE 1 | A MATERIAL DEVELOPMENT SET | GRAIN DIAMETER DISTRIBUTION MEASUREMENT |
| 10 | FILE 02 | (30,10,0,0) | HIGH RESOLUTION MODE 1 | A MATERIAL DEVELOPMENT SET | GRAIN DIAMETER DISTRIBUTION MEASUREMENT |
| 11 | FILE 02 | (40,10,0,0) | HIGH RESOLUTION MODE 1 | A MATERIAL DEVELOPMENT SET | GRAIN DIAMETER DISTRIBUTION MEASUREMENT |
| 12 | FILE 02 | (50,10,0,0) | HIGH RESOLUTION MODE 1 | A MATERIAL DEVELOPMENT SET | GRAIN DIAMETER DISTRIBUTION MEASUREMENT |
| . . . | | | | | |

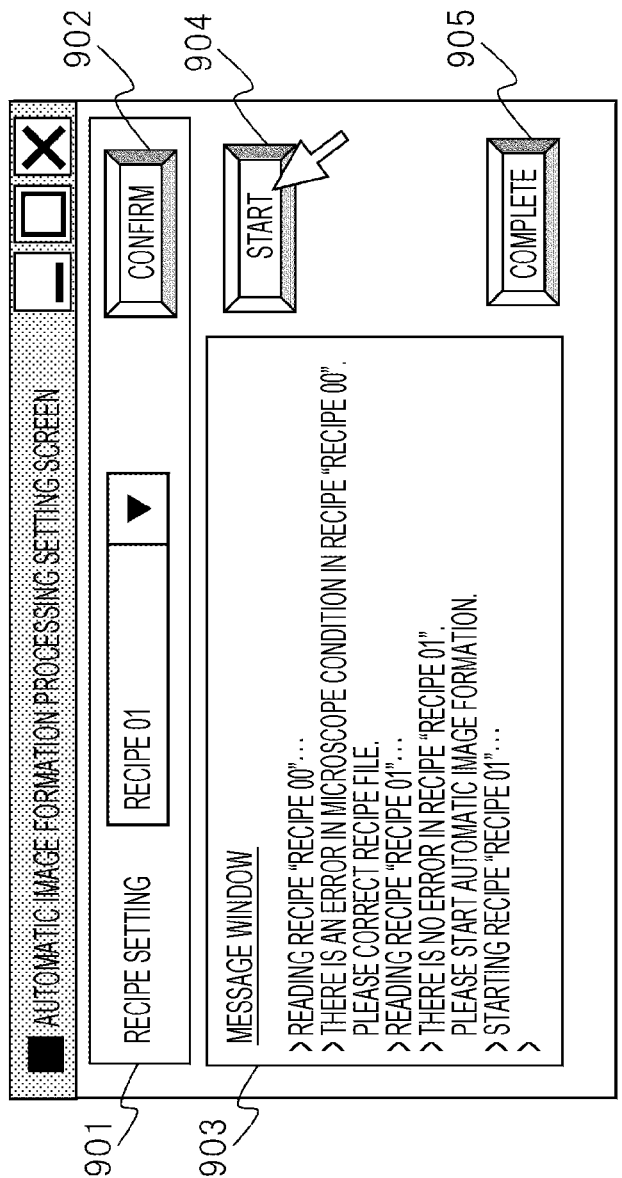

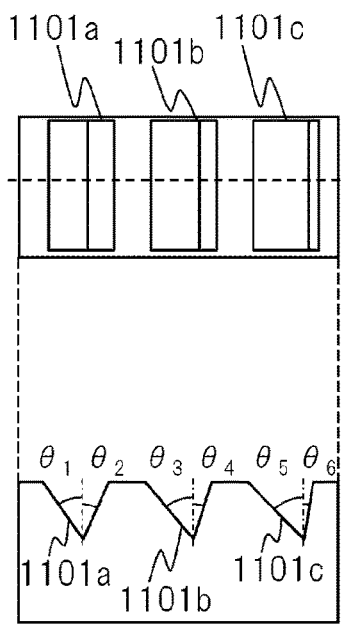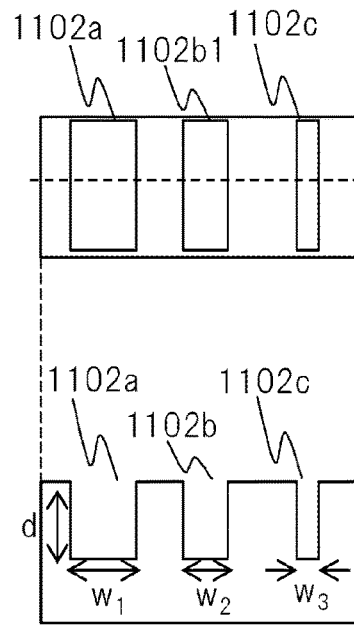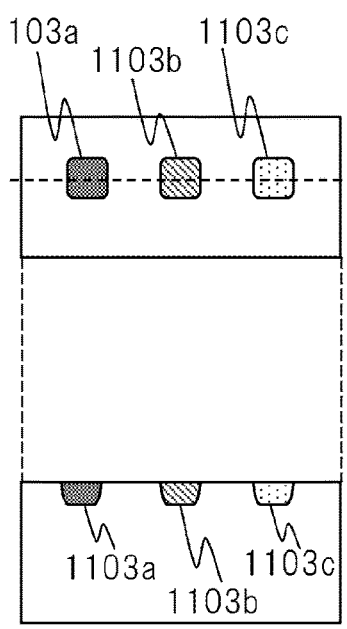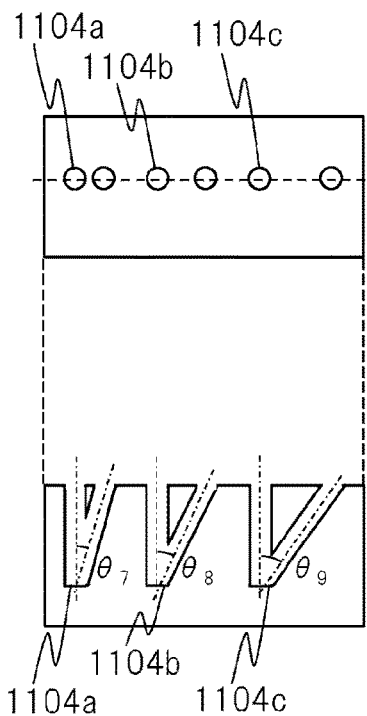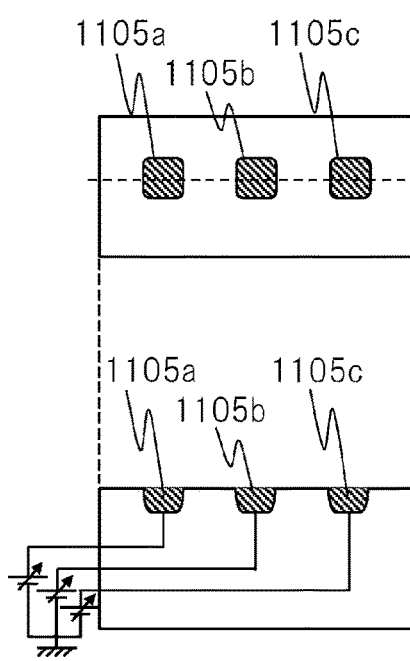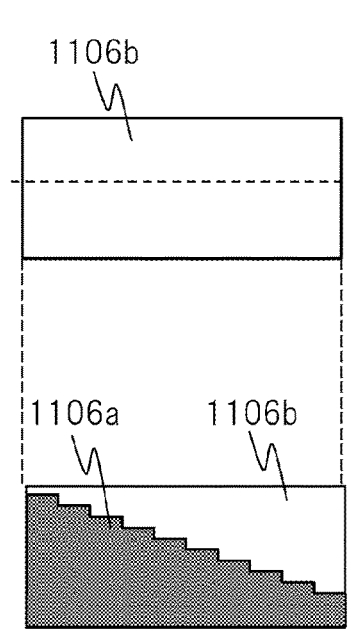

IMAGE FORMING APPARATUS

CROSS-REFERENCE TO RELATED APPLICATION

The present application claims priority from Japanese Patent Application No. 2017-025213 filed on Feb. 14, 2017, the content of which is hereby incorporated by reference into this application.

BACKGROUND OF THE INVENTION

1. Field of the Invention

The present invention relates to a technique for forming an image in a microscope.

2. Description of the Related Art

Observation using a microscope is conducted for the purpose of confirming the fine shape of a sample surface and the like. In particular, in material development, since a compositional distribution of a sample and a phase distribution of the surface thereof represent the properties of a material, it is important to extract information such as a compositional distribution and a crystal type and orientation of a phase on the basis of observation results. As an apparatus for performing such observation, there is a scanning electron microscope (SEM) for acquiring signals of secondary charged particles such as secondary electrons generated by irradiating an electron beam. JP 2012-018813 A describes a technique of superimposing and displaying a surface shape photographed by an SEM and color information photographed by an optical microscope. In addition, U.S. Pat. No. 4,941,980 describes a technique with which a radiation signal emitted in a detection direction from a sample surface is three-dimensionally measured by detectors arranged in four directions symmetrical with respect to the sample surface, and information such as an accurate position of a projection on the sample surface is extracted from an output signal of each detector.

SUMMARY OF INVENTION

Extracting various types of information from a plurality of images for the purpose of material development and the like is considered to be very effective. JP 2012-018813 A is one example of this. Two images, that is, an SEM image and an optical microscope image, are taken as one sheet of image while two types of information, that is, surface shape information as luminance and color information as a color are separable from the two images. However, this technique cannot be applied to a case where signals each having pieces of information that are mixed and separable are used.

In addition, in U.S. Pat. No. 4,941,980, shape information is successfully acquired by acquiring a difference in radiation directions of detection signals. However, this technique is a special example in which it can be utilized that the information held by the signal is greatly different from the shape information. When the signal of an SEM image is discriminated on the basis of angle or energy, the SEM image becomes an image illustrating characteristics corresponding to the signal, but information cannot be completely separated and is in a mixed state. For this reason, information necessary for material development such as composition and phase distribution cannot be separated. That is, although the signal forming the SEM image has much information and is thought to be applicable to analytical applications, since the state of separation of the information included in the signal is uncertain, it is extremely difficult to evaluate and analyze each piece of information quantitatively.

To solve the above problem, the present invention provides an image forming apparatus configured to separate and extract a plurality of pieces of information by using a plurality of sheets of microscope images formed from a plurality of types of signals and output the image with the extracted information further enhanced or masked according to a user's desire. This image forming apparatus includes an observation image input section, an emphasis information input section, a storage section, an image calculation section, and an emphasized image output section. In the observation image input section, a plurality of observation images is input. In the emphasis information input section, information to be emphasized is input. In the storage section, the plurality of observation images is converted into a converted image on the basis of a function for conversion, and a plurality of conversion functions that takes, as a parameter, a gradation value of each pixel in the plurality of observation images and a plurality of emphasis functions that takes, as a parameter, a gradation value of each pixel in the conversion functions are defined. The image calculation section calculates an image in which information to be emphasized is emphasized on the basis of the input plurality of observation images, the input information of the information to be emphasized, the conversion functions, and the emphasis functions. The emphasized image output section outputs the emphasized image.

According to the present invention, information in the image can be extracted at high speed and provided to the user as meaningful quantitative data.

BRIEF DESCRIPTION OF THE DRAWINGS

FIG. 7 is a recipe created prior to executing automatic processing for automatically acquiring a plurality of images according to a fourth embodiment of the present invention;

FIG. 9 is an automatic image forming processing setting screen according to the fourth embodiment of the present invention;

FIGS. 11A to 11F are schematic diagrams of sample pieces for calibration 1009 according to the fifth embodiment of the present invention;

DESCRIPTION OF THE PREFERRED EMBODIMENTS

Figure 1:
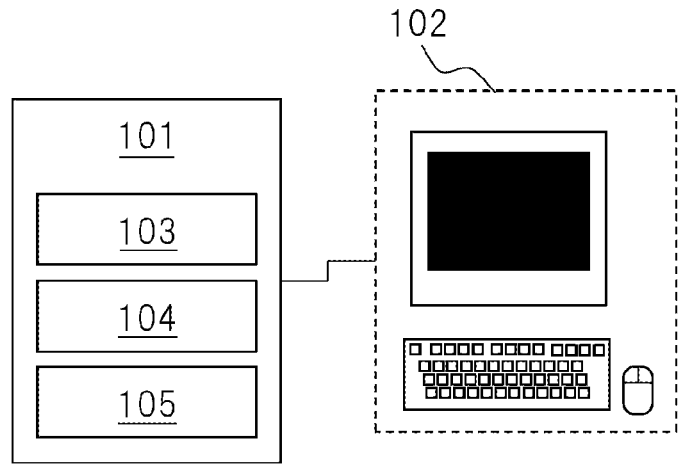
FIG. 1 is a diagram for describing a schematic configuration of an image forming apparatus according to a first embodiment of the present invention.

Hereinafter, a number of embodiments of the present invention will be described in detail with reference to the drawings. Note that in all the drawings for describing the embodiments, the same elements are denoted by the same reference numerals, and the repetitive description thereof is omitted.

First Embodiment

FIG. 1 is a diagram illustrating a schematic configuration of an image forming apparatus according to a first embodiment of the present invention.

The image forming apparatus includes a system control section 101 and an input/output section 102 including an image display device. In the system control section 101, a data input section 103, a storage device 104, and a calculation section 105 are arranged. The data input section 103 is connected, for example, to a device that can output an image in real time or offline such as a microscope, or a device that can temporarily store and output an image such as an external storage medium, thereby inputting, to the image forming apparatus, an image and a condition under which the image has been acquired, or image data with the image and the condition integrated. Note that in the present embodiment, there is illustrated an example in which the data input section 103 is connected to an external device holding an image and image data is input to the image forming apparatus. However, the microscope may be directly connected to the system control section 101, and may be provided in a part of the image forming apparatus.

A plurality of pieces of image data are input to the data input section 103 simultaneously or sequentially, and the input image data is stored in the storage device 104, and displayed on the image display device provided in the input/output section 102 as necessary. In the present embodiment, there is illustrated a case where this plurality of pieces of image data is plural types of images formed from signals that are of the same type, but are discriminated according to energy and angle emitted from the sample. The image forming apparatus performs calculation processing for the plurality of pieces of image data by the calculation section 105, forms an information enhanced image, and displays the information enhanced image on the image display device provided in the input/output section 102, or stores the formed information enhanced image in the storage device 104. This image forming procedure will be described with reference to FIGS. 2 and 3.

Figure 2:
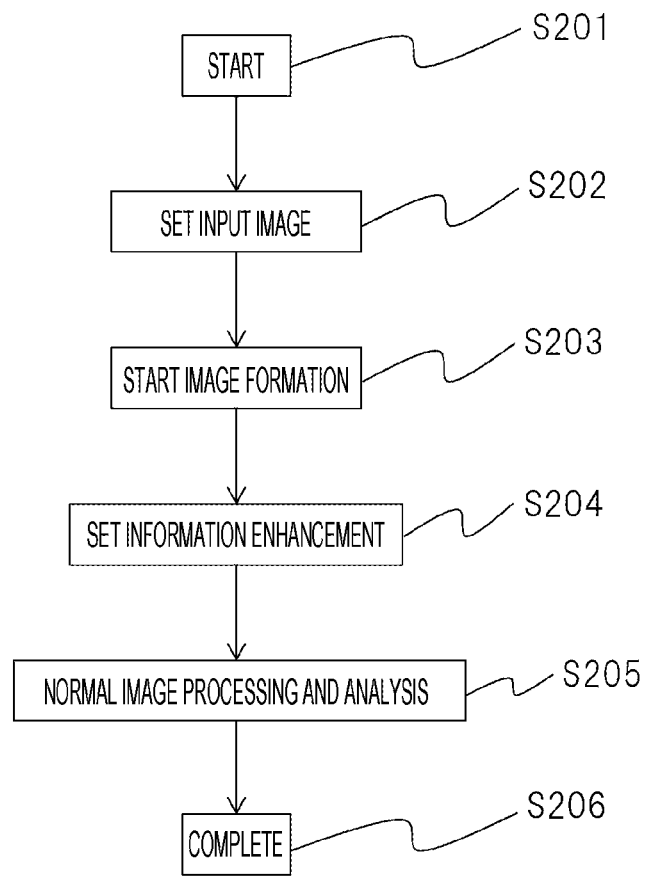
FIG. 2 is a flowchart illustrating a procedure of image forming processing according to the first embodiment of the present invention.

FIG. 2 is a flowchart illustrating a procedure of image forming processing according to the first embodiment of the present invention. An operator starts a flow via the input/output section 102 including the image display device (step S201 in FIG. 2). The image forming screen illustrated in FIG. 3 appears on the image display device. Hereinafter, description will be given with reference to FIG. 3, unless otherwise noted. The operator sets an input image through the input image setting section 301 (step S202). In the present embodiment, either a checkbox for setting file reading or a checkbox for manual input is check-marked and selected.

Figure 3:
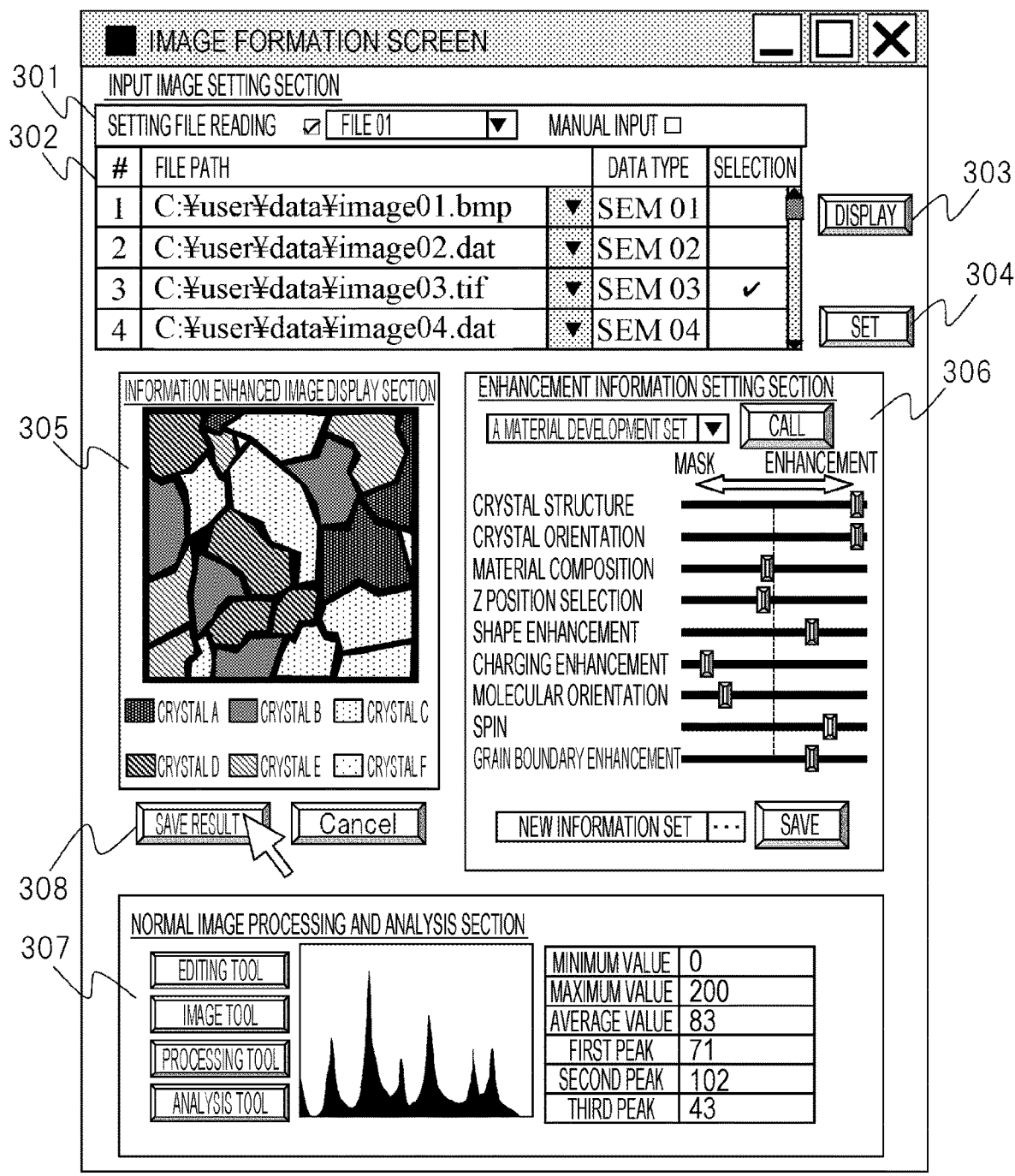
FIG. 3 is an image forming screen according to the first embodiment of the present invention.

FIG. 3 illustrates an example in which setting file reading is selected. When a setting file is selected from a pull-down, the file saved in the storage device 104 is read in accordance with the selection, and the contents of the file is displayed as an input image condition 302 in the input image setting section 301. In a case where the checkbox for manual input is check-marked, each item in the input image condition 302 is manually input. Input image conditions include an image number, a file path, a data type, and the like.

In the present embodiment, the "file path" is a file name including a path to a file of data that is input to the image forming apparatus through the data input section 103 in FIG. 1 and saved in the storage device 104. Note that in the present embodiment, there has been illustrated an example in which saved images are read offline. However, in a case where some of these saved images are set to microscope images acquired in real time, for example, the file name is set like Realtime 01. This 01 represents a signal channel, and a name corresponding to each of a plurality of channels of the image forming apparatus is given. The "data type" represents a type of a signal forming each image. In the present embodiment, #1 to #4 are images acquired by SEM, and a number added after "SEM" entered in the data type such as 01 represents a number for classifying a type such as energy and angle on the basis of which a signal forming the SEM image is discriminately acquired. According to this classification, for example, SEM 01 represents a signal having an azimuth angle of 0 degree to 30 degrees, an elevation angle of 5 degrees to 10 degrees, and energy 2 keV to 2.1 keV.

The SEM images that have been discriminated and classified in this manner is characterized in that the SEM image includes information such as a crystal structure, a crystal orientation, a material composition, a surface shape, a surface potential, a spin at different ratios depending on a range of the signal discrimination.

When a selection field in the input image condition 302 is check-marked and a display button 303 is pressed, a window for confirmation opens, the image selected by check-marking and conditions of the image are displayed, and the input image can be confirmed (not illustrated). Note that four types of data #1 to #4 are displayed as data in FIG. 3, but by moving the scroll bar on the right side, it can be confirmed that more data is input.

When the input image is input as described above and a setting button 304 is pressed, image formation corresponding to the input contents of the input image condition 302 is started by the calculation section 105, and at the same time, an information enhanced image is displayed in an information enhanced image display section 305 (step S203). At this time, the information enhanced image is subjected to image calculation according to settings in an enhancement information setting section 306. The operator moves the slide bar to enhance or mask each piece of information illustrated in the enhancement information setting section 306 while confirming the information enhanced image, and determines each information enhancement amount (step S204).

In the present embodiment, there has been illustrated an example in which a crystal structure, a crystal orientation, a material composition, a Z position selection, shape enhancement, charging enhancement, a molecular orientation, a spin, and grain boundary enhancement can be selected as information to be enhanced or masked. For example, when the information on the crystal structure is enhanced, a contrast according to crystallinity (e.g., cubic, monoclinic, and amorphous) possessed by each crystal grain in the information enhanced image is emphasized. For example, selecting the Z position results in an image with a contour line of the sample emphasized. A slide bar for selecting the height of the contour line or the like may be displayed on a new window or the like. Similarly, for examples of other information, it is possible to create a state in which selected information is enhanced. This method for enhancing or masking will be described later.

In the present embodiment, it is possible to save an enhancement condition indicating how much each of these pieces of information is enhanced or masked and to call the enhancement condition. In the present embodiment, there is illustrated an example in which an enhancement condition "A material development set" is selected from a pull-down at the top of the enhancement information setting section 306 and a call button is pressed, whereby information saved as the enhancement condition is reflected on each slide bar.

In this way, in a case where a purpose is determined, for example, in a case where a certain material is to be developed, by determining an optimum condition in advance according to the purpose, it is also possible to automatically set a desired enhancement condition of the operator. In addition, it is possible to save a newly set enhancement condition using a save menu at the lower part of the enhancement information setting section 306.

Note that in the present embodiment, there has been illustrated an example in which a legend of the luminance in the information enhanced image is illustrated as a type of crystal. However, a legend illustrating a phase map and gray scale or color information without illustrating a legend in general may be illustrated. By the above means, the operator can form an image under a desired information enhancement condition. Next, the operator performs normal image processing and analysis (step S205) using a normal image processing and analysis section 307 in order to extract information as a numerical value from the image under the formed and desired information enhancement condition.

The normal image processing in the present embodiment refers to overall processing performed by a general image processing program that performs image calculation such as smoothing, binarization, filter processing, and shading removal. Similarly, the analysis refers to generally well-known overall image analysis such as profile and histogram analysis, extraction of specific values such as maximum luminance, and particle diameter analysis. In the present embodiment, a histogram is extracted from the information enhanced image and the analysis result is illustrated.

When the normal image processing and analysis end, the operator presses a result save button 308. As a result, the information enhanced image with the information enhancement condition determined in step S204 and the result analyzed in step S205 is saved in the storage device 104 and an image formation flow is completed (step S206). As a result of the above, the operator can compute on the basis of a plurality of pieces of input image data and extract data by enhancing desired information. Note that although not illustrated, it is possible to display a pop-up of information held by a pixel by pointing a cursor with the information enhanced image. In addition, it is also possible to confirm the information enhanced image a three-dimensional image corresponding to the gradation of the image by using a three-dimensional display option. In addition, the image forming apparatus according to the present embodiment also includes a function of displaying the certainty of the result according to contents input in the input image condition 302 or the like.

Figure 4:
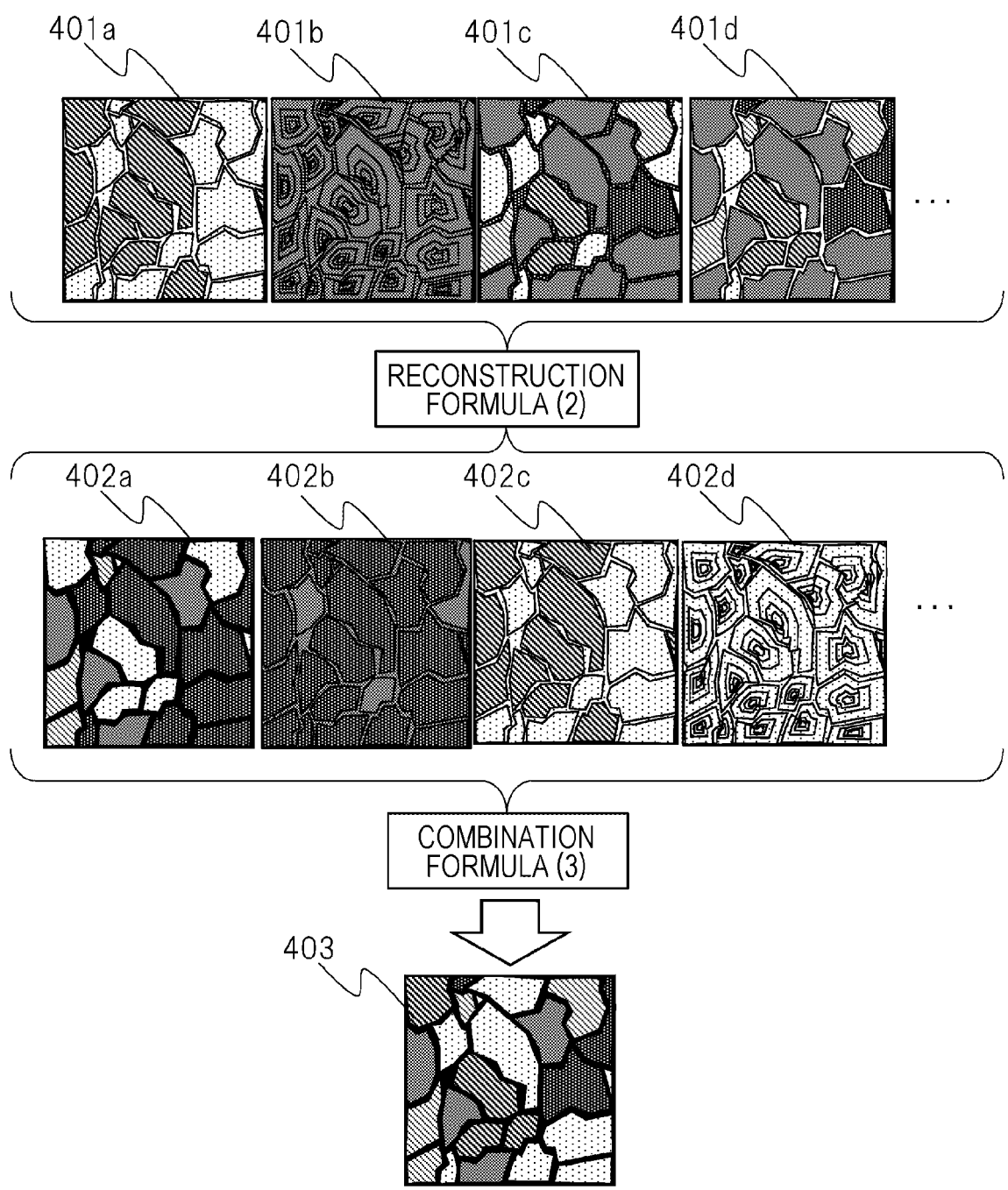
FIG. 4 is conceptual diagrams of a method of enhancing/masking information on the basis of a plurality of pieces of image data according to the first embodiment of the present invention.

Next, a method of enhancing or masking each piece of information illustrated in the enhancement information setting section 306 on the basis of the plurality of pieces of image data illustrated in the input image condition 302 will be described. FIG. 4 is a conceptual diagram of the method. Image data 401a to 401d before information enhancement respectively correspond to the plurality of pieces of image data #1 to #4 illustrated in the input image condition 302 in FIG. 3. In the present embodiment, there is illustrated a case where the number of pieces of image data is four. However, even in a case where the number of pieces of data is larger than four, the effects of the present invention are not lost.

As described above, the image data before enhancement are images formed of signals that are of the same type, but discriminated according to energy and angle emitted from the sample. In the present embodiment, a type of the signal is expressed as a data type. The image data 401a to 401d are SEM images that have been subjected to signal discrimination and classification and that include information such as a crystal structure, a crystal orientation, a material composition, a surface shape, a surface potential, a spin, at different ratios according to a range of the signal discrimination. It is difficult to quantitatively evaluate each piece of information from uncertain signals having mixed information in this way. Therefore, in the present embodiment, it is assumed that the image data is a linear combination of each pieces of information with information included in the image data being taken as parameters, and the image data is expressed as Formula (1).

[Mathematical Formula 1]

$$I(s, x, y) = \sum_i c(s, i) I(s, x, y) \qquad \text{Formula (1)}$$

I is image data, s is a data type, x and y are coordinates in the image, i is information, and c is a ratio of information of the data type. In the case of a monochrome image, I is taken as a scalar. In the case of a color image, I is taken as a three-dimensional vector. Also in the case of more multi-dimensional image data, the number of dimensions may be increased according to the degree.

In the present embodiment, Formula (1) and a parameter c of Formula (1) are determined on the basis of empirical rules, stored in the storage device 104 as an image calculation parameter list, and values for the image calculation parameter list are selected according to the data type in the input image condition 302. In Formula (1), as the value of the parameter c approaches 1, this means that the image data includes much information of the data type. There are Formulas (1) corresponding to the number of types of image data included in the input image condition 302. When Formulas (1) is reconstructed by extracting only terms expressing the information s of all data types and summing the extracted terms, an information image L having much information s as illustrated in Formula (2) is formed.

[Mathematical Formula 2]

$$I_i(x, y) = \sum_s c(s, i)I(s, x, y) \qquad \text{Formula (2)}$$

At this time, as a result of calculation, the luminance of the image may exceed an upper limit determined by an image format. Therefore, in order that the information is not lost, if the image format is, for example, an 8-bit image format, the luminance is reset to fall between 0 and 255.

In addition, in some cases, it may be better to adjust the luminance of the image data prior to the calculation of Formula (2), depending on the image acquisition condition of each image data. An example of such cases is that the luminance adjustment is performed under different conditions such that each image of the image data 401a to 401d is easy to see, and images cannot be compared in terms of absolute signal amount. In a case where a condition for luminance adjustment is given to the image data and saved, the image data is converted into an image that can be compared in terms of absolute signal amount. In a case where the adjustment condition is not saved, the certainty of the image after the information enhancement deteriorates.

As described above, in the present embodiment, a function of displaying an index of the deterioration is given, and the degradation index is represented by a minus points system. In addition, the points of the deterioration index are deducted as the number of pieces of image data is smaller. Furthermore, the coarser the resolution of the discrimination of the signal forming the image data is, the more the points of the deterioration index are deducted. In this way, the calculation section 105 performs calculation processing according to Formula (2) with respect to the image data 401a to 401d and forms information images 402a to 402d.

The information images 402a to 402d may be stored in the storage device 104 or may be stored temporarily to form an information enhanced image 403. Next, using these information images 402a to 402d, the information enhanced image 403 is formed on the basis of the following Formula (3).

[Mathematical Formula 3]

$$I_{out}(x, y) = \sum_i a(i)I_i(s, x, y) \qquad \text{Formula (3)}$$

Formula (3) illustrates that the information enhanced image 403, that is, an $I_{out}$ is an image acquired by linearly combining the information images 402a to 402d at a ratio a(i). Herein, the ratio a(i) is determined according to a position s(i) of the slide bar in the enhancement information setting section 306 in FIG. 3 such that the sum of a(i) is 1. When the left end of each slide bar is defined as the minimum (0) and the right end is defined as the maximum (100) and the value s(i) changes linearly according to the position, the value of the ratio a(i) is expressed by Formula (4).

[Mathematical Formula 4]

$$a(i) = \frac{s(i)}{\sum_i s(i)} \qquad \text{Formula (4)}$$

Formulas (2) to (4) are recorded in the image calculation parameter list in a way similar to that in Formula (1).

From the above, in order to quantitatively evaluate each piece of information from an uncertain signal having mixed information, each piece of information illustrated in the enhancement information setting section 306 can be enhanced or masked on the basis of the plurality of pieces of image data.

Note that in the present embodiment, there has been illustrated a method for quantitatively evaluating each piece of information from uncertain signals having mixed information using SEM images that have been subjected to signal discrimination and classification as a plurality of pieces of image data. Note that even in a case where the plurality of pieces of image data includes a composition image on the basis of scanning electron microscopy-energy dispersive X-ray spectroscopy (SEM-EDX), color information by an optical microscope, or a microscope image in which information of a signal used for analysis is clearly separated such as a surface shape image acquired by a scanning probe microscope (SPM) including an atomic force microscope (AFM), the effects of the present invention are not lost. In addition, in the present embodiment, there has been illustrated an example of displaying only one sheet of information enhanced image. However, performing image processing, for example, forming a plurality of sheets of information enhanced images under different enhancement conditions and comparing these information enhanced images is more helpful in interpreting images.

Second Embodiment

In the first embodiment, Formula (1) that takes, as a parameter, information included in image data to expresses the image data, Formula (2) that is reconstructed by extracting the information from Formula (1), and Formula (3) that adds optimum information enhancement are expressed by a linear combination on the basis of empirical coefficients. However, in some cases, information becomes more accurate when other functions that are not a linear combination are applied to Formulas (1) and (2). Also in Formula (3), coefficients are determined according to empirical rules corresponding to the type of material development. Therefore, a possibility of a function other than a linear combination and a possibility that a more suitable condition exists cannot be ignored.

Furthermore, since the parameter c indicating the ratio of information in each data type is a value acquired empirically, and there is no means for accurately separating information, there is room for improvement. Therefore, in the present embodiment, there is illustrated an example in which deep learning is applied to Formulas (1) to (3) and the parameter c, and an optimum Formula and parameter are searched to update Formulas (1) to (3) and the parameter c. An apparatus configuration and an image forming method are similar to those in the first embodiment, and description thereof will be omitted.

Formulas (1) to (4) and a parameter c of Formulas (1) to (4) are stored in a storage device 104 in FIG. 1 as the image calculation parameter list. In addition, in the present embodiment, acquired image data and an acquired information image and information enhanced image are stored in a database in the storage device 104. Herein, an evaluation index is attached to each of the image data of the information image and the image data of the information enhanced image, and deep learning in which Formulas (1) to (3) and the parameter c are updated is performed such that the evaluation index becomes high. As a result, more accurate information can be extracted to perform an optimal image calculation. In addition, in a case where the image calculation parameter list is updated, a previous formed image is updated, and images before and after the update can be compared.

Note that in the present embodiment, there has been illustrated an example using the deep learning as an optimum solution search technique. However, the effects of the present invention are not lost even in a case where other search techniques using machine learning or other artificial intelligence are used.

Third Embodiment

In the first and second embodiments, there has been illustrated an example in which the data input section 103 is connected to an external device holding an image and image data is input to the image forming apparatus. In the present embodiment, an example in which an image is formed efficiently by providing a microscope in an image forming apparatus will be illustrated.

Figure 5:
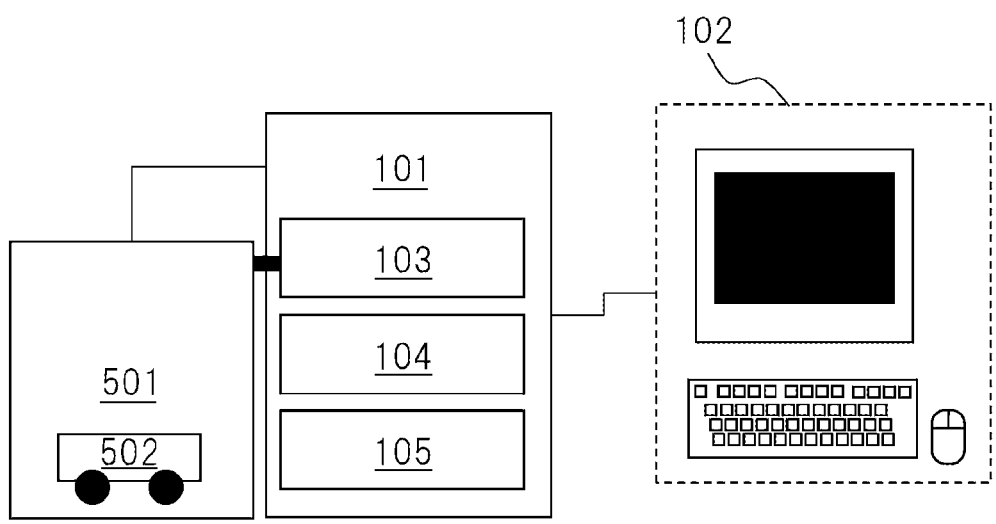
FIG. 5 is a diagram for describing a schematic configuration of an image forming apparatus according to a third embodiment of the present invention.

FIG. 5 is a diagram illustrating a schematic configuration of the image forming apparatus according to the third embodiment of the present invention. A system control section 101, an input/output section 102, a data input section 103, a storage device 104, and a calculation section 105 are similar to those in FIG. 1, and thus description thereof will be omitted. In the present embodiment, a microscope 501 is connected to the system control section 101 and the data input section 103. The system control section 101 transmits, to the microscope 501, a control signal, for example, for controlling an observation condition setting of the microscope 501 and a stage 502 for conveying a sample. The system control section 101 operates a microscope 501 uniformly. An operator can perform this operation through the input/output section 102.

In addition, an image data acquired by the microscope 501 according to the control signal from the system control section 101 is taken into the image forming apparatus through the input/output section 102. An image formation flow is similar to that in the first embodiment. In the present embodiment, the image data acquired by the microscope 501 is processed in real time. Therefore, a file path of an input image condition 302 in FIG. 3 is set in a channel number representation format like Realtime 01 and Realtime 02.

In the present embodiment, an SEM is applied as the microscope 501. Prior to image formation, an observation condition of the microscope 501 is determined, and then image formation processing is performed using a microscope image observed in real time as image data as described above. An observation condition determination method of the microscope 501 will be described with reference to FIG. 6. When the operator starts operation of the microscope via the image display device provided in the input/output section 102, a microscope operation screen illustrated in FIG. 6 appears on an image display device. The operator determines optical conditions first.

The optical conditions are, for example, a strength and an acceleration voltage of each lens constituting the microscope 501. In the present embodiment, an existing optical condition is saved in the storage device 104. When the operator reads a desired condition through a reading screen 601, the system control section 101 transmits the control signal to the microscope 501, and a selected optical condition is set automatically. Subsequently, the operator adjusts an optical axis using an optical axis adjustment screen 602 in order to sufficiently acquire the performance of the microscope 501.

When a button on the optical axis adjustment screen 602 is pressed, an optical axis adjustment window is displayed first and then a wobbler method or the like is applied. Then, the operator can adjust the optical axis so as to be optimum while viewing the image displayed on an image confirmation screen 604. Since details of the adjustment are general contents, description thereof will be omitted. When the adjustment of the optical axis is completed, the operator presses an observation button and a stop button on the right side of the image confirmation screen 604 as necessary, and changes various conditions while confirming the image while switching between the presence and absence of display. The conditions are changed using a condition setting screen 603.

The conditions are, for example, an imaging condition, an optical condition, and a coordinates condition. The imaging condition includes a scanning speed for acquiring an SEM image, an imaging magnification, a contrast of an acquired image, an acceleration voltage, and adjustment of focus on the sample. The optical condition includes adjustment of astigmatism. The coordinates condition includes coordinates of a stage 502 for conveying the sample. Note that in the present embodiment, for the stage 502, it is possible to set an X coordinate and a Y coordinate that represent directions perpendicular to the optical axis of the SEM that is the microscope 501 as well as a Rot coordinate that represents a rotation direction and a Tilt coordinate that represents a tilt direction. Note that in the present embodiment, when the stop button is pressed, the system control section 101 controls the microscope 501 such that the sample is not irradiated with an electron beam.

Figure 6:
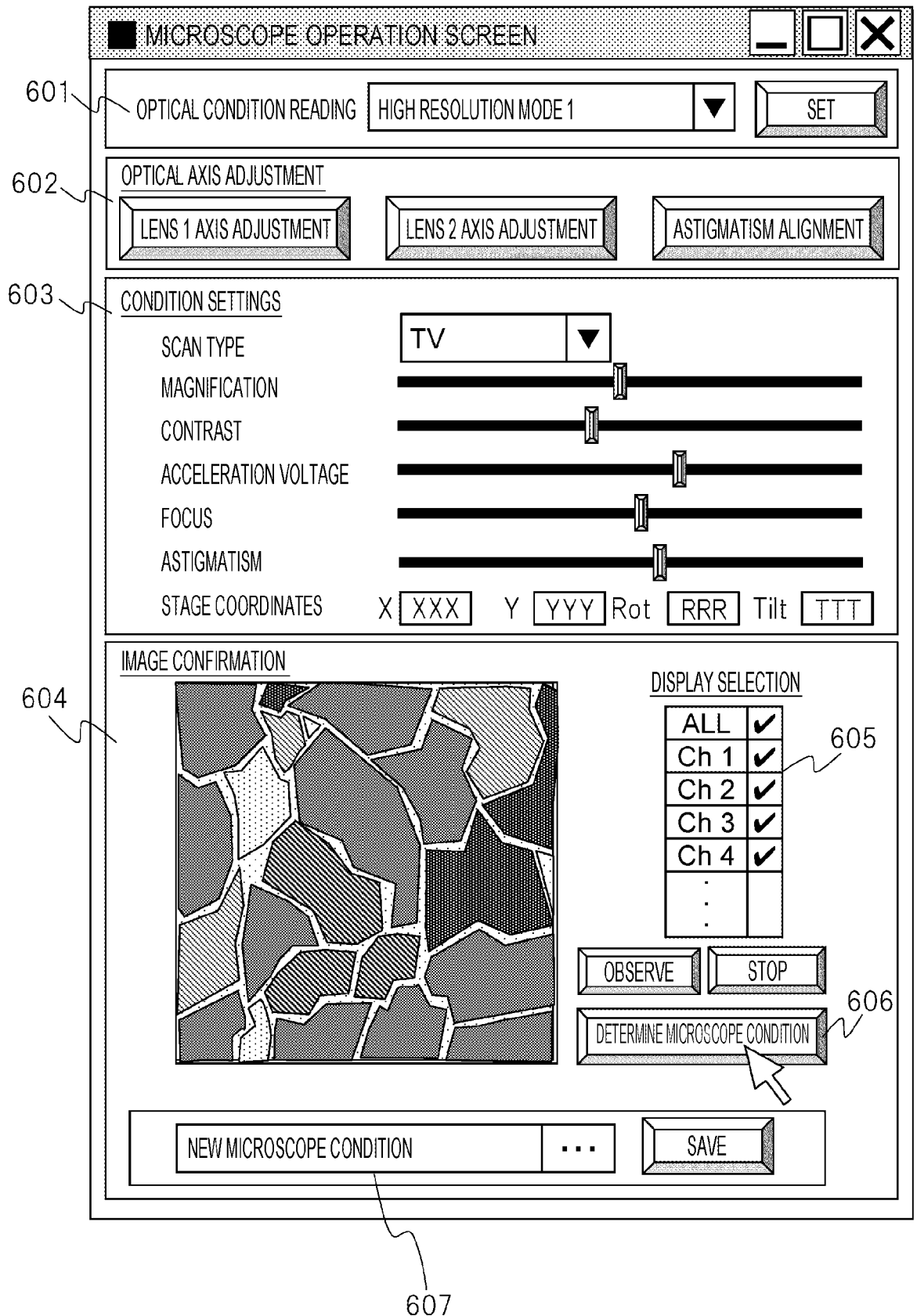
FIG. 6 is a microscope operation screen according to the third embodiment of the present invention.

Note that although not illustrated in FIG. 6, it is possible to save the image displayed on the image confirmation screen 604 or the image for each channel corresponding to each signal. Herein, in the present embodiment, a signal discriminated according to energy and angle emitted from the sample, or an image created by adding the signal is displayed on the image confirmation screen 604. The operator selects a type of a signal to be displayed, that is, a channel number of a detector, using a display selection screen 605.

As described above, purposes of acquiring this image are to adjust the microscope prior to the image formation and to determine the observation condition, and the image is acquired for temporary confirmation. Information extraction and desired image formation are performed after this condition determination. FIG. 6 illustrates an example in which by check-marking ALL on the display selection screen 605, settings that become equivalent to settings of a conventional SEM that adds all signals and does not perform information discrimination are selected. Finally, by pressing a microscope condition determination button 606, the microscope condition is determined. Note that in a case where the determined microscope condition is changed from the condition read on the reading screen 601 and needs to be updated, the microscope condition can be saved on a condition save screen 607.

The above procedures complete preparations for forming an image with enhanced information while using a microscope image observed in real time as image data, have been completed. A subsequent method for forming an image with enhanced information is similar to methods in the first and second embodiments, and thus description thereof will be omitted here. Note that as described above, it is possible to save an image of each channel, and image formation may be performed using the saved image as an input image later. By using this technique, it is possible not only to change an information enhancement setting later but also to update to an image having more accurate extracted information without a need to acquire the image again in a case where the image calculation parameter list for information image extraction is updated.

Fourth Embodiment

In the first to third embodiments, there has been illustrated an example in which an image with enhanced information on the basis of an input image saved in advance is formed or an example in which an image with enhanced information while acquiring an input image in real time is formed. In the present embodiment, there will be illustrated an example in which a plurality of images is automatically acquired according to a preset recipe. This technique is effective, for example, in cases where it is desired to create a distribution map or to create a database by observing one or a plurality of samples in a plurality of fields of view under the same condition or a plurality of different conditions all at once. In the present embodiment, there will be illustrated an example in which while an image is acquired by the microscope 501 in real time, an image with enhanced information is formed. Parts other than automatic processing are similar to those in the third embodiment, and thus description thereof will be omitted.

Prior to executing the automatic processing for automatically acquiring a plurality of images, the operator creates a recipe illustrated in FIG. 7. Items to be entered in the recipe are an input image, stage coordinates, a microscope condition, an image forming condition, and a post-processing condition. Among these items, for the input image, the microscope condition, and the image forming condition, a file name is entered so as to agree with the contents described in the embodiments 1 to 3, and for the stage coordinates and the post-processing condition, contents are directly described. Even in a case where contents other than these contents are described, the effects of the present invention are not lost.

In FIG. 7, as for the input image, there is assumed a case where setting file reading is performed by an input image setting section 301 in FIG. 3. In order to perform image formation while acquiring a microscope image in real time as in the third embodiment, all the input images are set as real images by setting like Realtime 01 . . . in this setting file.

In addition, a microscope condition is the same as the microscope condition illustrated in the third embodiment, and refers to a microscope condition that can be saved in advance in FIG. 6 and read from a reading screen 601 or a microscope condition that is determined in the method described in the third embodiment and saved by the condition save screen 607.

Similarly, in the image forming condition, a file name corresponding to the enhancement information determined in advance in an enhancement information setting section 306 according to the procedures of FIGS. 2 and 3 is described. In the stage coordinates, coordinates needed to be observed are described. In the post-processing condition, a type of necessary normal image processing (described in the first embodiment) is described. In FIG. 7, it is described that a series of processing are performed twelve times according to conditions. This number of times is set as necessary. From the above, a recipe for performing automatic processing can be set.

Figure 8:
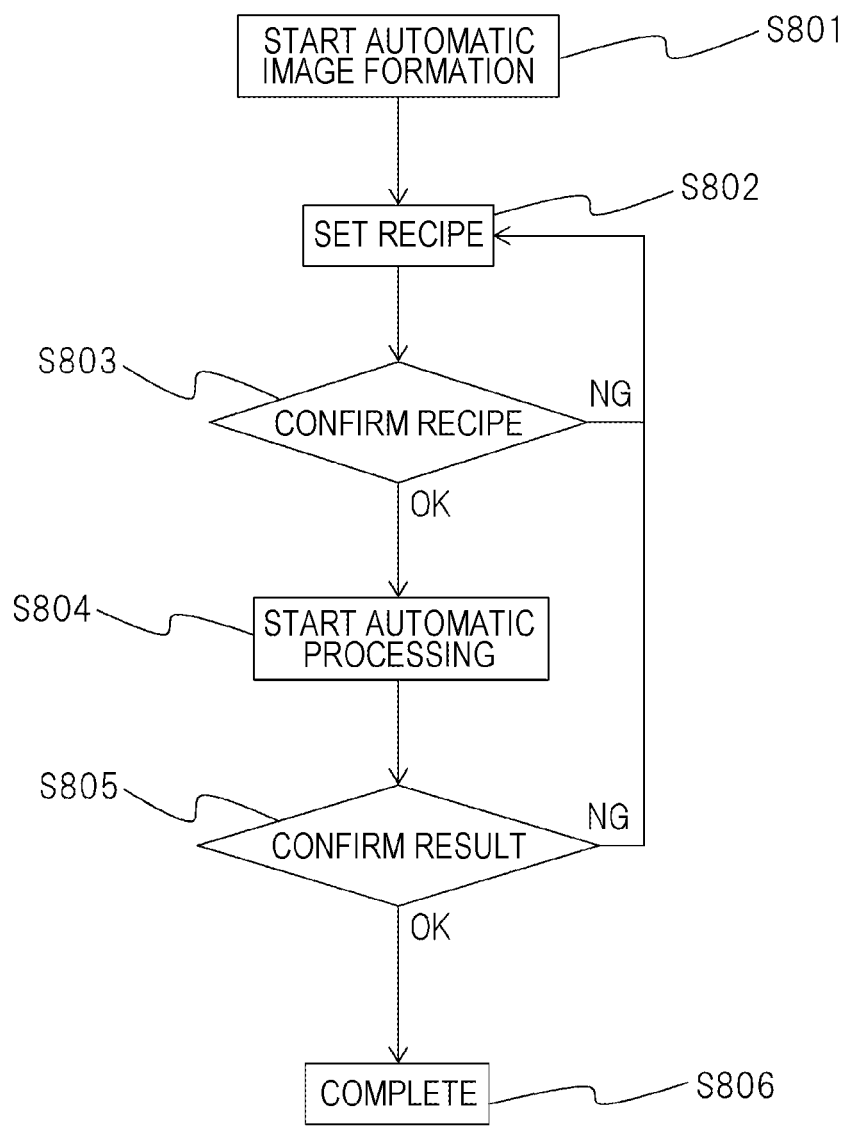
FIG. 8 is a flowchart illustrating a procedure of automatic image forming processing according to a fourth embodiment of the present invention.

FIG. 8 is a flowchart illustrating a procedure of automatic image forming processing according to the fourth embodiment of the present invention. The operator starts an automatic image formation flow via an input/output section 102 including an image display device (step S801 in FIG. 8). The automatic image forming processing setting screen illustrated in FIG. 9 appears on the image display device. Hereinafter, description will be given with reference to FIG. 9, unless otherwise noted. The operator reads and sets the recipe file created in the procedure described above on a recipe setting screen 901 to start the automatic processing in accordance with the set recipe (step S802).

When the operator presses a confirmation button 902, the system control section 101 confirms whether there is an error in the contents described in a recipe in cooperation with a storage device 104, the microscope 501, and a stage 502 (recipe confirmation step S803). In this step, a status is displayed in a message window 903 according to the presence or absence of an error such that the operator can easily understand contents of the error. FIG. 9 illustrates an example in which the message window 903 indicates that an error occurs in the microscope condition once in "recipe 00", the operator returns to the recipe creating to correct the recipe, and the error is solved in "recipe 01."

In this way, if there is an error, the operator returns to the recipe creating. When the error is solved, the operator presses a start button 904 and the processing proceeds to the automatic processing (step S804). Thereafter, the processing automatically proceeds according to the set recipe, and when all the processing described in the recipe is completed, a completion display appears on the message window 903. The operator confirms that there is no problem in the result (step S805). If there is a problem, the operator returns to the recipe setting again. If there is no problem, the operator presses a completion button 905 to complete the automatic image formation (step S806).

Note that in a case where the image forming processing described in the present embodiment takes much time than imaging by the microscope 501 described in the third embodiment, in order to shorten total time, imaging by the microscope 501 may be performed in advance without sequentially performing photographing by a microscope, the image forming processing and the normal image processing and analysis that are processing subsequent to the image forming processing. In addition, in the present embodiment, description has been given on the basis of the experimental configuration of the third embodiment and the method of forming an information enhanced image from real-time image acquisition. However, in the configuration of the first or second embodiment, it is of course also possible to automatically and sequentially perform offline processing for image data acquired in advance.

From the above, a plurality of images can be automatically acquired according to the preset recipe.

Fifth Embodiment

In the third embodiment, there has been illustrated an example in which the image formation is efficiently performed by providing the microscope 501 in the image forming apparatus. Herein, in the present invention, it is important that a plurality of pieces of image data is set as input images. The plurality of pieces of image data is a plurality of types of images acquired by imaging signals that are of the same type but have been discriminated according to energy and angle emitted from a sample. Therefore, in the present embodiment, there will be illustrated an example of a specific configuration for discriminating the signal according to energy and angle emitted from the sample in a microscope 501 (SEM).

Figure 10A:
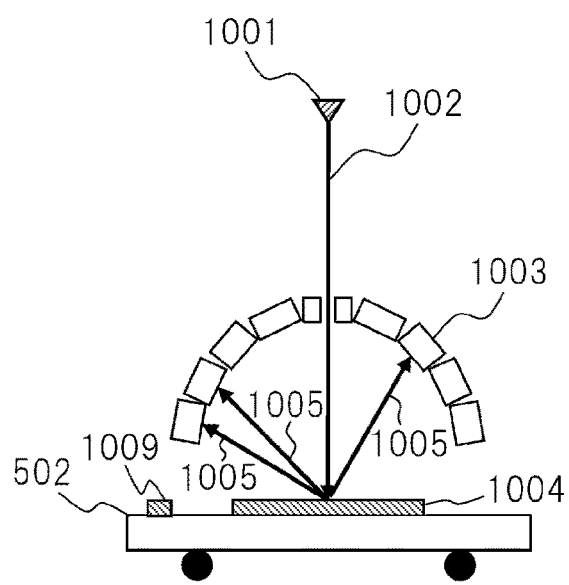
FIGS. 10A to 10C illustrate specific configurations of a microscope 501 according to a fifth embodiment of the present invention.
Figure 10B:
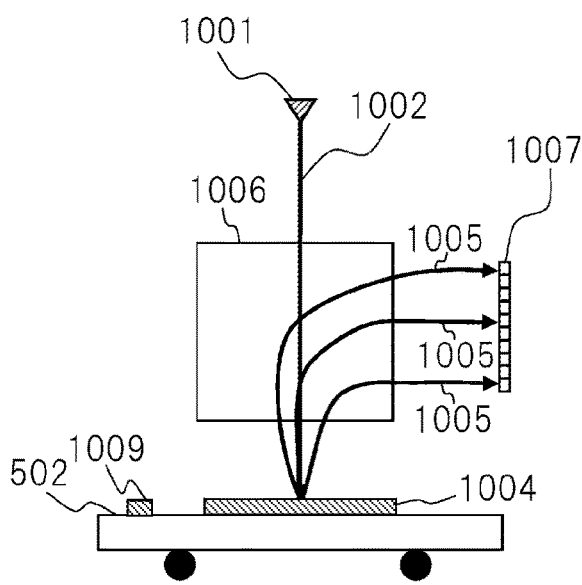

FIGS. 10A and 10B illustrates exemplary apparatus configurations of the microscope 501. Both FIGS. 10A and 10B illustrate configurations for discriminating the signal according to energy and angle emitted from the sample. First, FIG. 10A will be described. Detector arrays 1003 are arranged in a downstream direction from which an electron beam 1002 is drawn from an electron source 1001. Although not illustrated, various optical elements such as various lenses, a scanning deflection deflector, an optical axis adjusting aligner, an aberration corrector are added to an electron optical system.

A stage 502 is configured to move with a sample 1004 placed thereon. In addition, as will be described later in detail, a sample piece for calibration 1009 is mounted on the stage 502. The sample piece for calibration 1009 is intended to confirm that discrimination of energy and an angle of the signal electron 1005 to be detected using the microscope 501 is as per expected and to perform calibration. Although not illustrated, each section of an electron source 1001, the detector arrays 1003, the various optical elements, and the stage 502 is connected to the system control section 101 and uniformly controlled.

In addition, although not illustrated, it is needless to say that constituent elements other than a control system and a circuit system are arranged in a vacuum container, and are operated by evacuation. In addition, it is needless to say that a sample conveyance system for arranging the sample 1004 on the stage 502 from the outside of the vacuum is provided. The system control section 101 controls various electron optical systems, whereby the sample 1004 is irradiated with the electron beam 1002 and interacts, and a signal electron 1005 is generated. The detector arrays 1003 are arranged in a spherical shape as seen from a position at which the signal electron 1005 is generated, and thus signal discrimination is made possible according to angle at which the signal electron 1005 is generated and that reaches the detector array 1003.

In the configuration of FIG. 10A, in order to irradiate the sample 1004 with the electron beam 1002, the detector array 1003 cannot be arranged on an optical axis, and it is necessary to leave an empty space on the optical axis. Therefore, the signal electron 1005 traveling toward the optical axis cannot be acquired. FIG. 10B illustrates a configuration in which a beam separator 1006 is applied in order to solve this problem.

In FIG. 10B, the beam separator 1006 is arranged in the downstream direction from which the electron beam 1002 is drawn from the electron source 1001. A point that various optical elements are added to the electron optical system, a point that the structure and each section of the stage 502 are connected to the system control section 101 and uniformly controlled, a point that each constituent element is arranged in a vacuum container and operated by evacuation, and a point that the sample conveyance system for arranging the sample on the stage 502 from the outside of the vacuum are all similar to the configuration in FIG. 10A. A point that the sample piece for calibration 1009 is mounted on the stage 502 is similar to the configuration in FIG. 10A.

Herein, when the sample 1004 is irradiated with the electron beam 1002 and the signal electron 1005 generated by interaction arrives at the beam separator 1006, the signal electron 1005 is deflected in a direction different from a direction in which the electron beam 1002 travels from the electron source 1001. FIG. 10B illustrates an example in which the electron beam 1002 travels straight from the electron source 1001 toward the sample 1004 and the signal electron 1005 travels toward the right side of the figure. However, the directions of both the electron beam 1002 and the signal electron 1005 can be changed by a configuration of the beam separator 1006. In the present embodiment, a magnetic field sector using a deflection action of a magnetic field is used as the beam separator 1006, and although not illustrated, in order to cause the electron beam 1002 travel straight, a configuration of a split type magnetic pole that allows the electron beam 1002 pass through a chicane orbit is adopted.

In order to cause the electron beam 1002 travel straight, there may be adopted a configuration in which deflection to the electron beam 1002 is canceled out and only the signal electron 1005 is deflected by combining electric field deflection and magnetic field deflection. In the configuration of FIG. 10B, the signal electron 1005 is deflected by the beam separator 1006 and reaches a detector array 1007. From the above, with the configuration of FIG. 10B, discriminated detection can be performed by each detector constituting the detector array 1007 according to angle at which the signal electron 1005 is generated.

Figure 10C:
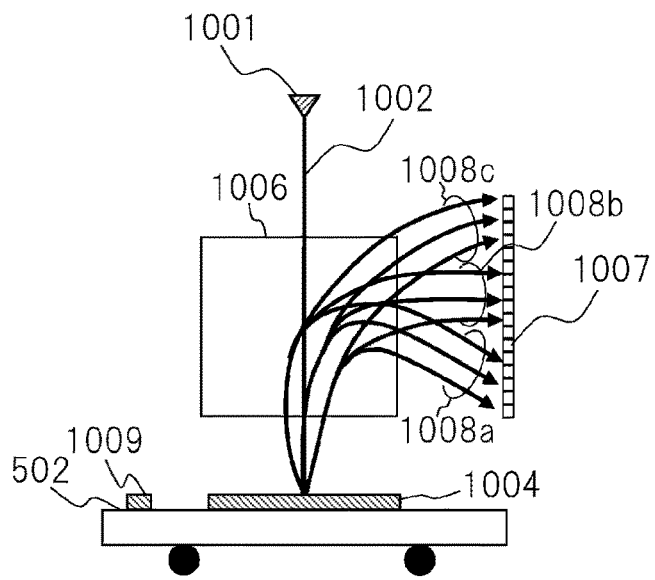

FIGS. 10A and 10B illustrate apparatus configurations for performing signal discrimination according to angle at which the signal electron 1005 is generated. In the present invention, discrimination is performed according to energy in addition to according to an angle at which the signal electron is generated. FIG. 10C is an example in which both energy and angle are discriminately detected using the configuration of FIG. 10B. Again, the basic configuration is similar to that in FIG. 10B. The beam separator 1006 changes the traveling direction of the signal electron by an electron beam deflection action of an electric field or a magnetic field.

Herein, as the energy of the electron beam is higher, the deflection action given to the signal electron is smaller and chromatic dispersion occurs. When this chromatic dispersion is used, a signal electron 1008a having high energy has a small amount of deflection and reaches the upper part of the detector array 1007 in the figure. Since the deflection amount of a signal electron 1008b having medium energy is average, the signal electron 1008b reaches the middle part of the detector array 1007. A signal electron 1008c having low energy is greatly deflected and reaches the lower part of the detector array 1007 in the figure. The action of chromatic dispersion is controlled more sufficiently greatly than a difference in positions of signal electrons on the detector array 1007 where the signal electrons arrive in angle discrimination. This makes it possible to discriminate and detect both angle and energy.

Note that as methods other than the method in the present embodiment, it is also possible to adopt modes such as an energy filter method in which a mesh to which a negative voltage is applied in front of a detector is arranged, and an energy filter method in which a slit is arranged at an exit of a sector of an electric or magnetic field.

Subsequently, there will be described a method of confirming that the energy and an angle of the signal electron to be detected using the microscope 501 are discriminated as per expected and a method of calibrating. As described above, the sample piece for calibration 1009 used for this calibration is mounted on the stage 502. FIGS. 11A to 11F are schematic diagrams of the sample pieces for calibration 1009, and illustrate examples of six types of samples A to F, respectively.

In FIGS. 11A to 11F, the upper diagrams are top views and the lower diagrams are cross-sectional views taken along dotted lines in top views. These figures will be described in sequence. FIG. 11A illustrates a sample having on the surface thereof surface tilted structures 1101a to 1101c each having a tilt angle. The surface tilted structures 1101a to 1101c have tilts of $\theta_1$ to $\theta_6$ with respect to the optical axis. Therefore, in a case where the electron beam 1002 reaches the sample, the signal electron 1005 is emitted at an emission angle corresponding to the tilt angle. A characteristic is that the angle can be calibrated by measuring which detector the signal having each angle has reached.

FIG. 11B has a plurality of groove structures 1102a to 1102c. In this example, the depth is fixed to a depth d and the width varies among $w_1$ to $w_3$. As a result, in a case where the electron beam 1002 reaches a groove bottom, a part of the signal electron 1005 emitted is blocked by a groove wall, and the angle of the signal electron 1005 to be detected is restricted according to a ratio between the depth of the groove structure and the width of the groove structure. Therefore, a characteristic is that the angle can be calibrated by measuring which detector the signal having each angle has reached.

In FIG. 11C, different material regions 1103a to 1103c are formed on a substrate. Since an emitted amount of the signal electron is material-dependent, the emitted amount of the signal electron varies according to a location irradiated with the electron beam 1002. That is, a characteristic is that the yield of the signal electron can be calibrated by measuring an irradiation current first, measuring a signal electron current emitted from each material, and obtaining a ratio of the measured signal electron current to the measured irradiation current.

In FIG. 11D, pairs each consisting of two non-through openings 1104a to 1104c having the same depth are formed. As for the pair of non-through openings, one is an almost vertical opening and the other is a tilted opening. The positions of both the openings are coincident with each other at the bottom of the openings, and in the example illustrated in FIG. 11D, the tilt angle of the tilted openings varies among $\theta_7$ to $\theta_9$. As a result, when the bottom of the opening is irradiated with the electron beam 1002 from the vertical opening and the signal electron 1005 is generated, only a signal corresponding to an angle near to $\theta_7$ to $\theta_9$ is detected. That is, a characteristic is that a detector that acquires the signal electron emitted at a specific angle can be determined and calibrated.

In FIG. 11E, electrodes 1105a to 1105c are arranged on the top of a substrate, and since a voltage can be partially applied, the detailed energy change of the signal electron can be measured. That is, a characteristic is that an energy distribution can be calibrated by measuring the signal electron current acquired by each detector.

FIG. 11F illustrates a structure in which an upper layer 1106b that is flat is stacked on a lower layer 1106a that is stepped. The lower layer 1106a is made of a material different from a material of the upper layer 1106b, and the material of the lower layer 1106a is heavier than the material of the upper layer 1106b. When this sample is irradiated with the electron beam 1002, the depth of electron penetration varies according to the accelerating voltage of the electron beam 1002. A characteristic is that since the height of the lower layer 1106a varies according to a location, the presence or absence of a signal including the information in the lower layer can be confirmed by measuring the amount of a generated signal electron, and an entrance length can be calibrated.

As described above, by observing the samples in FIGS. 11A to 11F with the apparatuses illustrated in FIGS. 10A to 10C and examining the position of the detector where the signal electron has reached, it becomes possible to calibrate each piece of information such as an angle, energy, a yield, and an entrance length of the signal electron. Calibration lists such as the angle and energy of the signal electron acquired by each detector of the detector array, or the entrance length and the yield are stored in the storage device 104. An initial value of the calibration list is a numerical value acquired by simulation, and the initial value is updated by calibration.

Figure 12:
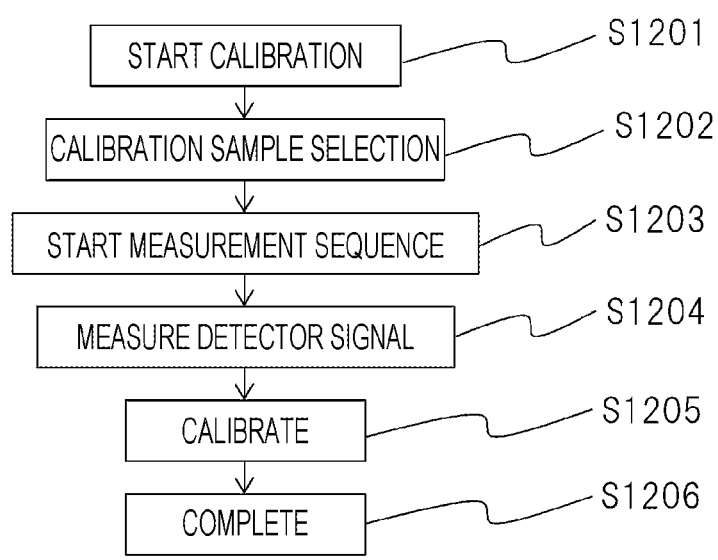
FIG. 12 is a calibration flowchart of the microscope 501 according to the fifth embodiment of the present invention.

Note that the shapes of the sample pieces for calibration 1009 illustrated in FIGS. 11A to 11F are representative examples, and the effects of the present invention are not lost also in a case where a sample piece for calibration having a different structure is used. Next, a procedure for calibrating the microscope 501 using this sample piece for calibration 1009 will be described with reference to FIGS. 12 and 13. FIG. 12 is a flowchart illustrating the procedure for calibrating the microscope 501 according to a fifth embodiment of the present invention. An operator starts a calibration flow via an input/output section 102 including an image display device (step S1201 in FIG. 12). A microscope calibration screen illustrated in FIG. 13 appears on the image display device. Hereinafter, description will be given with reference to FIG. 13, unless otherwise noted.

Figure 13:
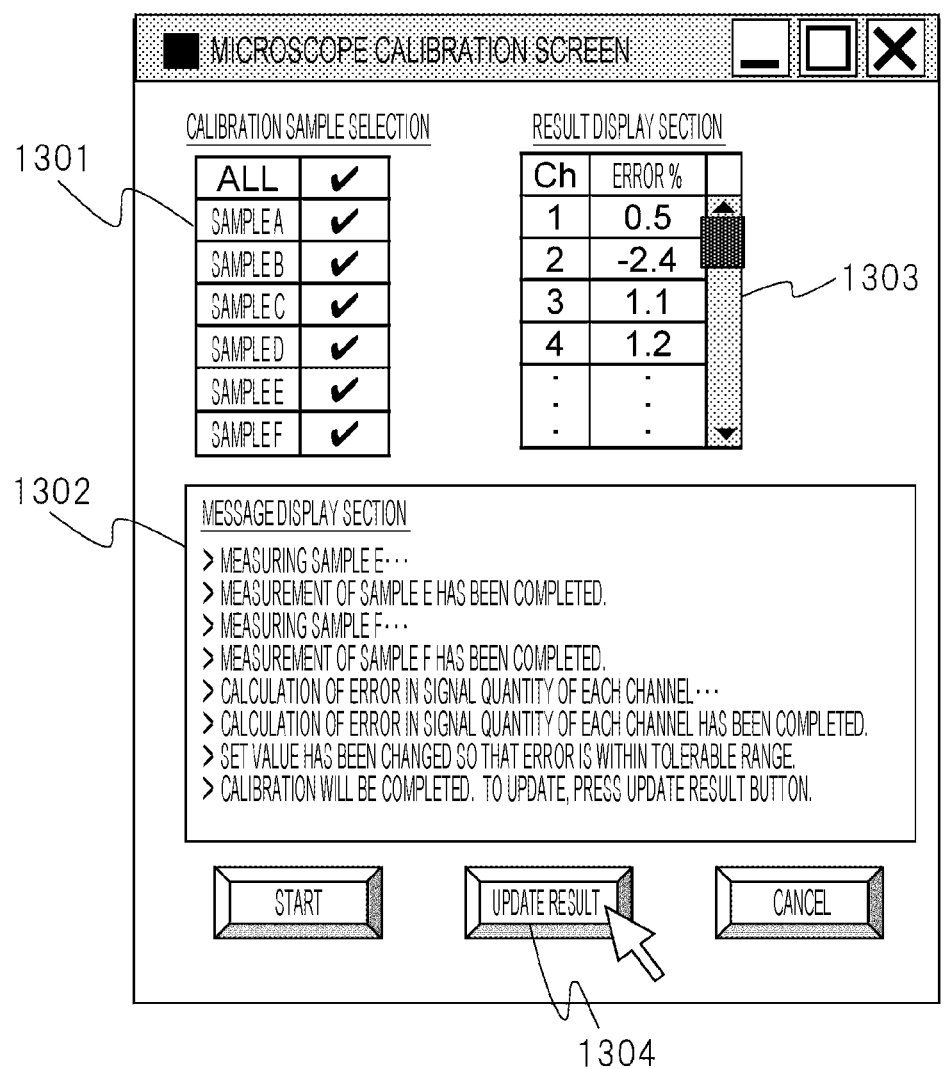
FIG. 13 is a calibration screen of the microscope 501 according to the fifth embodiment of the present invention.

The operator selects the sample piece for calibration 1009 to be used to calibrate the microscope 501 from a calibration sample selection section 1301 (step S1202). In the present embodiment, a plurality of samples can be selected from six types of samples A to F illustrated in FIG. 11. However, necessary samples may be automatically selected. The operator may select all of the samples according to a type of calibration or may select only a sample corresponding to a necessary calibration. FIG. 13 illustrates an example in which ALL is check-marked to use all samples for calibration.

When the operator presses a calibration start button, a message telling that the calibration has started is displayed on a message display section 1302, and the system control section 101 sends a signal to various control elements, whereby the measurement sequence for calibration starts (step S1203). The stage 502 moves such that the microscope 501 observes each sample for calibration. Observation is performed at each position of each sample piece under a predetermined observation condition. An amount of the signal electron detected by each detector of the detector array 1003 or the detector array 1007 is temporarily recorded in the storage device 104 (step S1204).

Note that since the measurement of a signal yield is performed at the same time, an emitted electron beam current is also measured at the same time. The message display section 1302 sequentially displays, for example, that the measurement of each sample is underway and that the measurement of each sample has been completed. When all the measurements are completed, the calibration list stored in the storage device 104 is read, a calculation section 105 performs calibration by comparing the initial value in the read calibration list with each detector value measured in a detector signal measuring step, and a temporary file of the calibration list is created (step S1205). An error of the result after calibration is displayed on a result display section 1303. If there is no problem in the result, the operator presses a result update button 1304 to reflect the value of the temporary file into the calibration list and save in a storage device 104 (step S1206).

From the above, it is possible to discriminate signals according to energy and angle emitted from the sample by adopting the configurations of FIGS. 10A to 10C as specific configurations of the microscope 501. A subsequent method of forming an image with enhanced information, by using a microscope image acquired using the present configuration as image data is similar to those in the first and second embodiments, and thus description of the method will be omitted here.

An embodiment of the present invention is useful as an image forming apparatus for extracting information held by a sample.

What is claimed is:

1. An image forming apparatus comprising:
a storage device in which a plurality of conversion functions that takes, as a parameter, a gradation value of each pixel in the plurality of observation images, and a plurality of emphasis functions that takes, as a parameter, a gradation value of each pixel in the conversion functions, are defined;
an image acquisition facility for acquiring the plurality of images, the image acquisition facility internally includes a stage for conveying a sample and a sample for calibration on the stage, wherein the sample for calibration includes an opening region including a plurality of pairs each including two non-through openings having the same depth, the non-through openings being a combination of a substantially vertical opening and a tilted opening, the non-through openings having opening positions that are coincident with each other at a deepest portion of the non-through openings, the tilted opening having at least three types of tilt angles; and
a computer communicatively coupled to the storage device, the computer configured to execute instructions to:
receive a plurality of observation images as input;
receive inputs indicative of information to be emphasized;
calculate an image in which information to be emphasized is emphasized based on the plurality of observation images, the inputs indicative of the information to be emphasized, the conversion functions, and the emphasis functions; and
output the emphasized image.

2. The image forming apparatus according to claim 1, wherein:
signals that form the plurality of images are a plurality of images that includes signals acquired by separating signals generated based on the same generation condition according to energy or angle.

3. The image forming apparatus according to claim 1, wherein
the image acquisition facility includes an optical system,
the image forming apparatus sets an image acquisition condition including at least either an optical condition of the optical system or coordinates of the stage to control the image acquisition facility, and
the image acquisition condition and the plurality of images together with the image acquisition condition are stored in the storage device.

4. The image forming apparatus according to claim 3, wherein:
the image acquisition facility is a microscope including two or more detectors arranged in an array.

5. The image forming apparatus according to claim 3, wherein:
the image acquisition facility further includes a sample for calibration on the stage; and
the sample for calibration includes at least one of:
a surface tilted region having three or more types of tilt angles,
a groove region having three or more types of ratios between a depth of the groove region to a width of the groove region,
a material region including three or more types of single materials,
an opening region including a plurality of pairs each including two non-through openings having the same depth, the non-through openings being a combination of a substantially vertical opening and a tilted opening, the non-through openings having opening positions that are coincident with each other at a deepest portion of the non-through openings, the tilted opening having at least three types of tilt angles,
a voltage region in which a voltage is partially applicable, and
a laminated layer region in which a lower layer and an upper layer are laminated, the lower layer including a material including a heavy element, the upper layer including a material including a light element, the lower layer having a stepped top end, the upper layer having a flat surface.

6. The image forming apparatus according to claim 1, wherein:
outputting the emphasized image comprises forming an image while contents calculated by the image calculation section are changed based on a predetermined condition setting file.

7. The image forming apparatus according to claim 1, wherein:
the plurality of emphasis functions is any two or more of a crystal structure, a crystal orientation, a material composition, a Z position selection, shape enhancement, charging enhancement, a molecular orientation, a spin, and grain boundary enhancement, and
the computer is further configured to calculate the image emphasized based on the plurality of emphasis functions.

8. The image forming apparatus according to claim 3, wherein:
the image acquisition facility further includes a sample for calibration on the stage; and
the sample for calibration includes a surface tilted region having three or more types of tilt angles.

9. The image forming apparatus according to claim 3, wherein:
the image acquisition facility further includes a sample for calibration on the stage; and
the sample for calibration includes a groove region having three or more types of ratios between a depth of the groove region to a width of the groove region.

10. The image forming apparatus according to claim 3, wherein:
the image acquisition facility further includes a sample for calibration on the stage; and
the sample for calibration includes a material region including three or more types of single materials.

11. The image forming apparatus according to claim 3, wherein:
the image acquisition facility further includes a sample for calibration on the stage; and
the sample for calibration includes a voltage region in which a voltage is partially applicable.

12. The image forming apparatus according to claim 3, wherein:
- the image acquisition facility further includes a sample for calibration on the stage; and
- the sample for calibration includes a laminated layer region in which a lower layer and an upper layer are laminated, the lower layer including a material including a heavy element, the upper layer including a material including a light element, the lower layer having a stepped top end, the upper layer having a flat surface.

* * * * *